United States Patent
Hsieh

(10) Patent No.: US 9,653,376 B1
(45) Date of Patent: May 16, 2017

(54) HEAT DISSIPATION PACKAGE STRUCTURE

(71) Applicant: CHIPBOND TECHNOLOGY CORPORATION, Hsinchu (TW)

(72) Inventor: Chin-Tang Hsieh, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/162,758

(22) Filed: May 24, 2016

(30) Foreign Application Priority Data

Dec. 17, 2015 (TW) .............................. 104142580 A

(51) Int. Cl.
*H01L 23/10* (2006.01)
*H01L 23/34* (2006.01)
*H01L 23/367* (2006.01)
*H01L 23/373* (2006.01)
*H01L 23/00* (2006.01)

(52) U.S. Cl.
CPC ...... *H01L 23/3675* (2013.01); *H01L 23/3736* (2013.01); *H01L 23/562* (2013.01)

(58) Field of Classification Search
CPC ..... H01L 2023/4037; H01L 2023/4056; H01L 2023/4062; H01L 23/373; H01L 23/40; H01L 23/3736
USPC ................ 257/706, 707, 712, 717, 720, 719
See application file for complete search history.

(56) References Cited

U.S. PATENT DOCUMENTS

| | | | |
|---|---|---|---|
| 6,747,350 B1 * | 6/2004 | Lin | ...................... H01L 23/3128 257/704 |
| 2004/0264136 A1 | 12/2004 | Houle | |
| 2006/0131735 A1 | 6/2006 | Ong et al. | |
| 2010/0019379 A1 | 1/2010 | Zhao et al. | |
| 2015/0279761 A1 | 10/2015 | Bet-Shliemoun | |

FOREIGN PATENT DOCUMENTS

| | | |
|---|---|---|
| TW | M482842 | 7/2014 |
| TW | M518405 | 3/2016 |

OTHER PUBLICATIONS

Taiwanese Office Action mailed Aug. 16, 2016 for Taiwanese Patent Application No. 104142580, 11 pages.

* cited by examiner

*Primary Examiner* — Sonya D McCall Shepard
(74) *Attorney, Agent, or Firm* — Jackson IPG PLLC; Demian K. Jackson

(57) ABSTRACT

A heat dissipation package structure includes a substrate, a chip disposed on the substrate and a heat dissipation sheet. The heat dissipation sheet comprises a covering portion disposed on a back surface of the chip, a first lateral covering portion disposed on a first lateral surface of the chip and a first conducting portion disposed on the substrate. The back surface comprises a first width, the covering portion comprises a second width, the chip comprises a thickness, and there is an interval between the chip and the substrate. The second width is not larger than summation of the first width, double the interval and double the thickness for making the chip disposed between the heat dissipation sheet and the substrate is not within a completely sealed space so as to prevent the heat dissipation sheet from deformation and separation from the chip or the substrate cause of air expansion.

14 Claims, 13 Drawing Sheets

HEAT DISSIPATION PACKAGE STRUCTURE

FIELD OF THE INVENTION

The present invention relates to a heat dissipation package structure, particularly relates to a heat dissipation package structure enables to prevent deformation caused by air expansion.

BACKGROUND OF THE INVENTION

A conventional package structure includes a substrate and a chip disposed on the substrate, wherein the chip is covered completely by a heat dissipation sheet to make the chip being within a completely sealed space formed between the heat dissipation sheet and the substrate for heat dissipation. However, air is also covered in the completely sealed space in coverage process to lead the thermal energy generated from the chip expand air volume in the completely sealed space. The expanding air will cause warpage and deformation of the heat dissipation sheet to make the heat dissipation sheet separate from the chip or the substrate, so as to damage the package structure or low heat dissipation efficiency of the chip.

SUMMARY

The primary object of the present invention is to enhance heat dissipation efficiency of the chip by preventing the heat dissipation sheet separate from the chip because of and deformation which are due to air expansion caused by the thermal energy generated from the chip.

A heat dissipation package structure of the present invention includes a substrate having a surface, a chip and a heat dissipation sheet. The surface of the substrate comprises a chip disposing area and at least one conducting area located outside of the chip disposing area. The chip is disposed on the chip-disposing area and reveals the conducting area, and the chip electrically to the substrate and comprises an active surface, a back surface, a first lateral surface, a second lateral surface, a third lateral surface and a fourth lateral surface, wherein the active surface faces toward the surface of the substrate, the first lateral surface is opposite to the second lateral surface, and the third lateral surface is opposite to the fourth lateral surface, wherein a interval is defined between the active surface of the chip and the surface of the substrate, and a thickness is defined between the active surface and the back surface of the chip, the back surface comprises a first lateral side connected to the first lateral surface and a second lateral side connected to the second lateral surface, wherein a first width is defined between the first lateral side and the second lateral side. The heat dissipation sheet is integrated and at least comprises a covering portion, a first conducting portion and a first lateral covering portion located between the covering portion and the first conducting portion, wherein the covering portion is disposed on the back surface of the chip, the first lateral covering portion is disposed on the third lateral surface, and the first conducting portion is disposed on the conducting area, wherein the covering portion comprises a first edge adjacent to the first lateral surface, a second edge adjacent to the second lateral surface, a third edge adjacent to the third lateral surface and a fourth edge adjacent to the fourth lateral surface, the third edge connects to the first lateral covering portion, a second width is defined between the first edge and the second edge, wherein the second width is not larger than summation of the first width, double the interval and double the thickness in same axis direction.

Owing to the second width of the covering portion is not larger than summation of the first width of the chip, double the interval and double the thickness of the chip, the space formed between the heat dissipation sheet and the substrate is not sealed completely. The present invention is able to prevent the heat dissipation sheet from warpage and deformation caused by the expanding air because the chip is not covered within the completely sealed space.

DETAILED DESCRIPTION OF THE INVENTION

Figure 1:
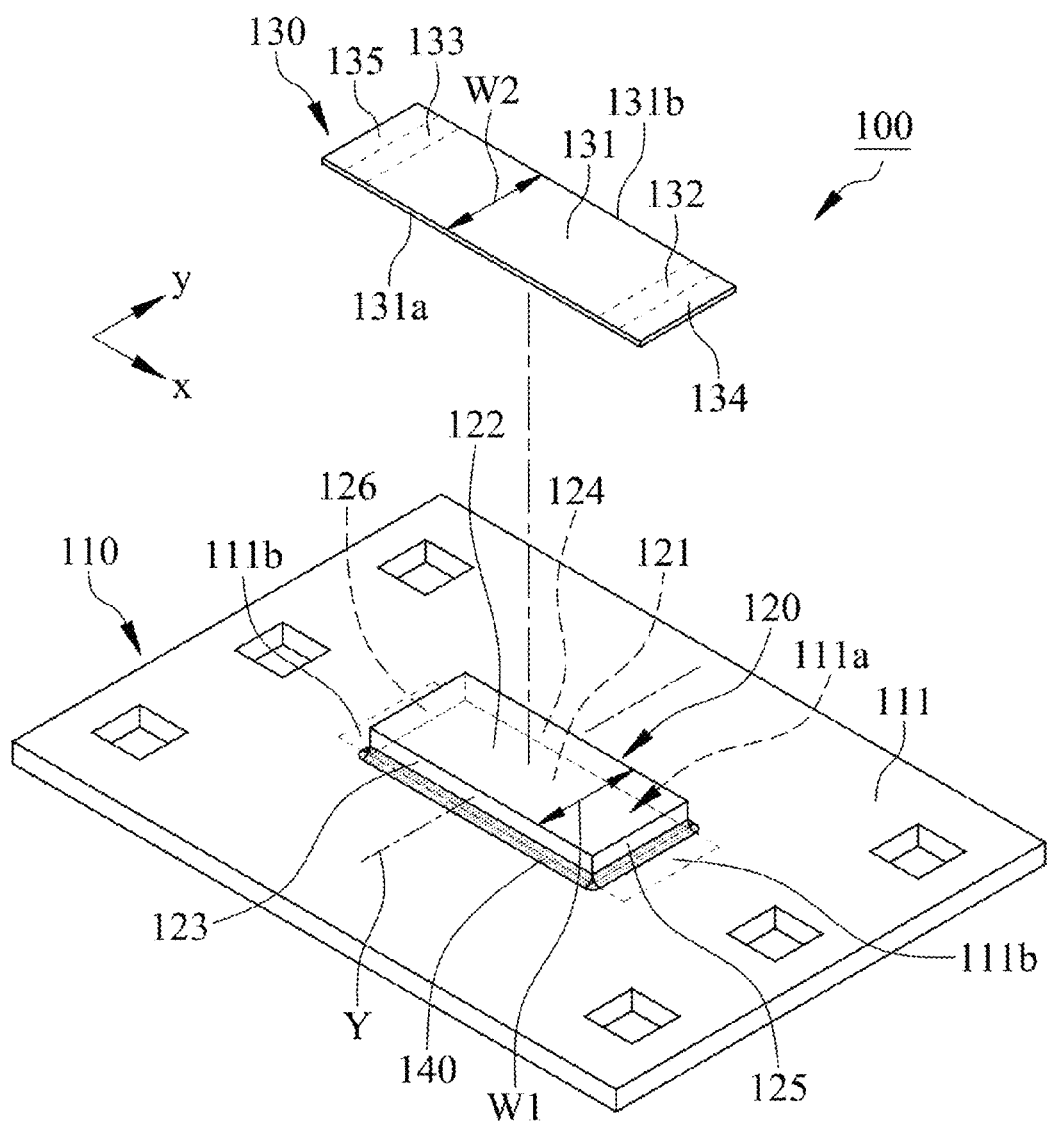
FIG. 1 is a perspective exploded diagram illustrating a heat dissipation package structure in accordance with a first embodiment of the present invention.

With reference to FIG. 1, a heat dissipation package structure 100 in accordance with a first embodiment of the present invention includes a substrate 110, a chip 120 and a heat dissipation sheet 130. The substrate 110 comprises a surface 111 having a chip-disposing area 111a and at least one conducting area 111b which is located outside of the chip-disposing area 111a. In this embodiment, the substrate 110 is a flexible printed circuit film.

Figure 2:
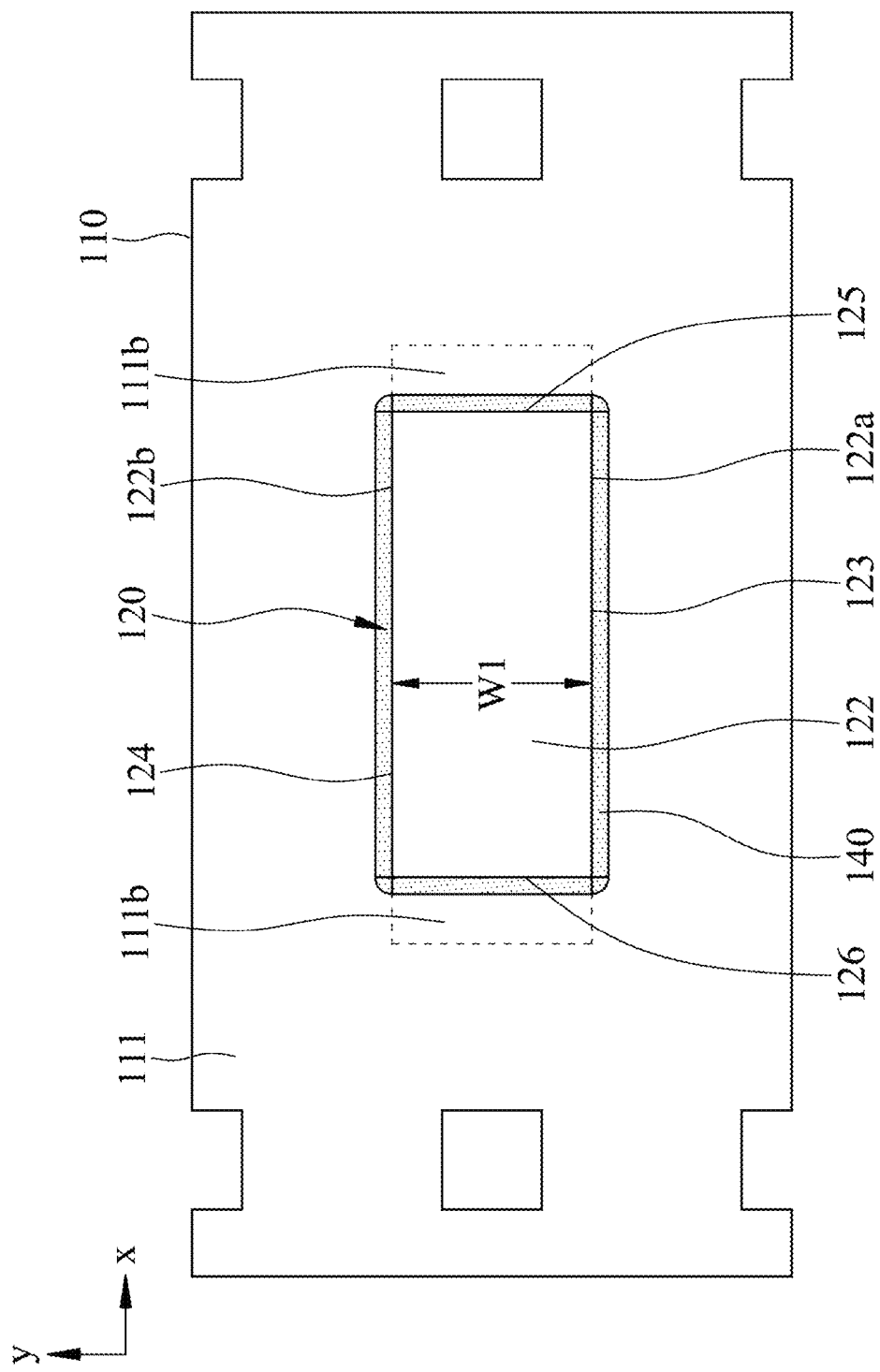
FIG. 2 is a top view diagram illustrating a substrate and a chip in accordance with the first embodiment of the present invention.
Figure 5:
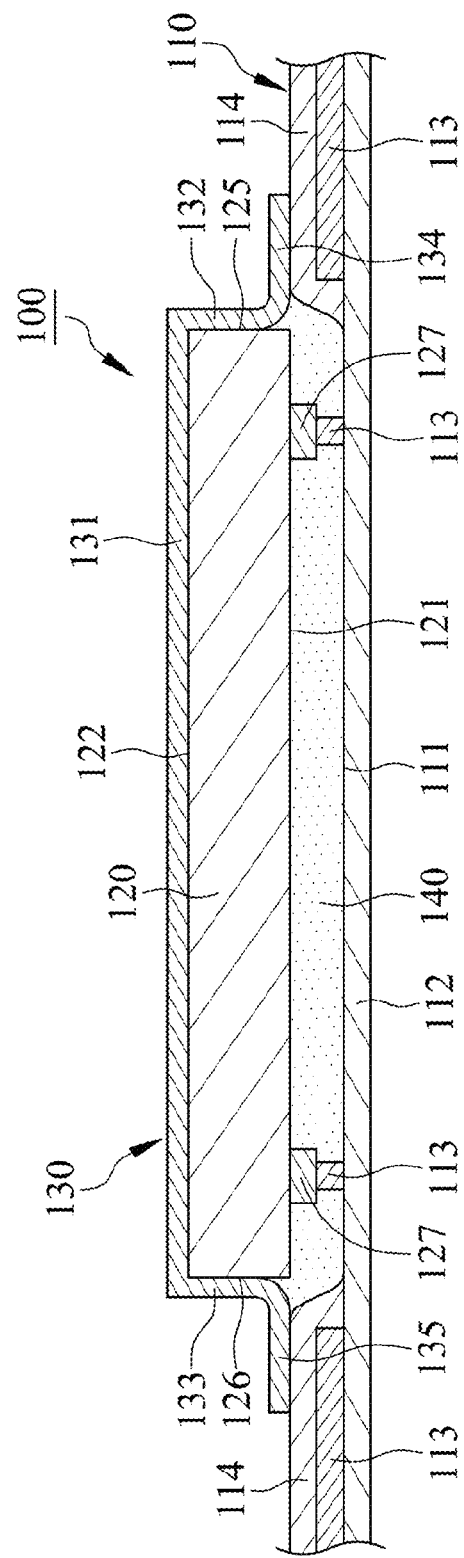
FIG. 5 is a cross-section view diagram illustrating the heat dissipation package structure in accordance with the first embodiment of the present invention.

With reference to FIGS. 1 and 2, the chip 120 is disposed on the chip-disposing area 111a and reveals the conducting area 111b. The chip 120 comprises an active surface 121, a back surface 122, a first lateral surface 123, a second lateral surface 124, a third lateral surface 125 and a fourth lateral surface 126, wherein the active surface 121 faces toward the surface 111 of the substrate 110, the chip 120 connects electrically to the substrate 110 via the active surface 121, the first lateral surface 123 is opposite to the second lateral surface 124, and the third lateral surface 125 is opposite to the fourth lateral surface 126, and wherein an axis line Y passes through the first lateral surface 123 and the second lateral surface 124. With reference to FIGS. 1 and 5, preferably, the heat dissipation package structure 100 further includes underfill 140 filling up between the active surface 121 of the chip 120 and the surface 111 of the substrate 110.

With reference to FIGS. 1 and 2, the back surface 122 comprises a first lateral side 122a connected to the first lateral surface 123 and a second lateral side 122b connected to the second lateral surface 124. The back surface 122 is in square or rectangular shape, preferably, the back surface 122 is in rectangular shape. The first lateral side 122a and the second lateral side 122b are long sides of the back surface 122, wherein a first width W1 is defined between the first lateral side 122a and the second lateral side 122b, and the first width W1 is the shortest distance between the first lateral side 122a and the second lateral side 122b in an axis direction. In this embodiment, the axis direction is the direction of a y-axis line.

Figure 3:
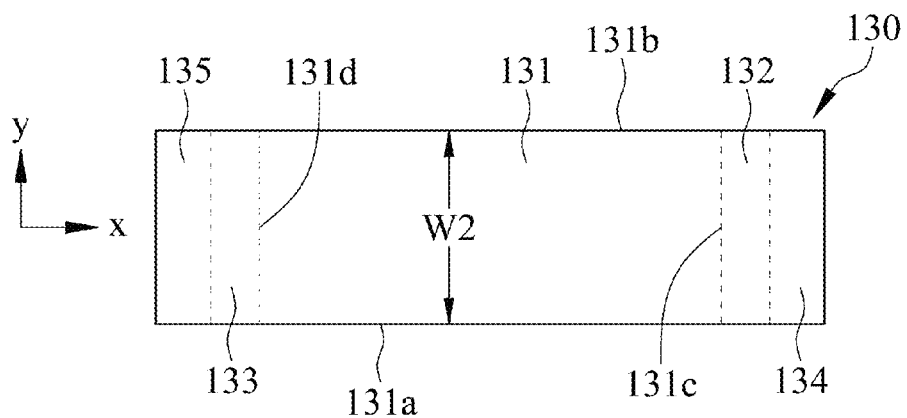
FIG. 3 is a top view diagram illustrating a heat dissipation sheet in accordance with the first embodiment of the present invention.

With reference to FIGS. 1 and 3, the heat dissipation sheet 130 is integrated and at least comprises a covering portion 131, a first lateral covering portion 132 and a first conducting portion 134, wherein the first lateral covering portion 132 is located between the covering portion 131 and the first conducting portion 134. Preferably, the heat dissipation sheet 130 further comprises a second lateral covering portion 133 and a second conducting portion 135, and wherein the second lateral covering portion 133 is located between the covering portion 131 and the second conducting portion 135. In the present invention, the heat dissipation sheet 130 is made of heat conducting material selected from gold, copper or aluminum.

With reference to FIGS. 1 and 3, the covering portion 131 comprises a first edge 131a adjacent to the first lateral surface 123, a second edge 131b adjacent to the second lateral surface 124, a third edge 131c adjacent to the third lateral surface 125, and a fourth edge 131d adjacent to the fourth lateral surface 126, wherein the third edge 131c connects to the first lateral covering portion 132, and the fourth edge 131d connects to the second lateral covering portion 133. A second width W2 is defined between the first edge 131a and the second edge 131b, and the second width W2 is the shortest distance between the first edge 131a and the second edge 131b in an axis line same with the first width W1. Preferably, the covering portion 131 is in rectangular shape, and the first edge 131a and the second edge 131b are the long sides of the covering portion 131.

Figure 4:
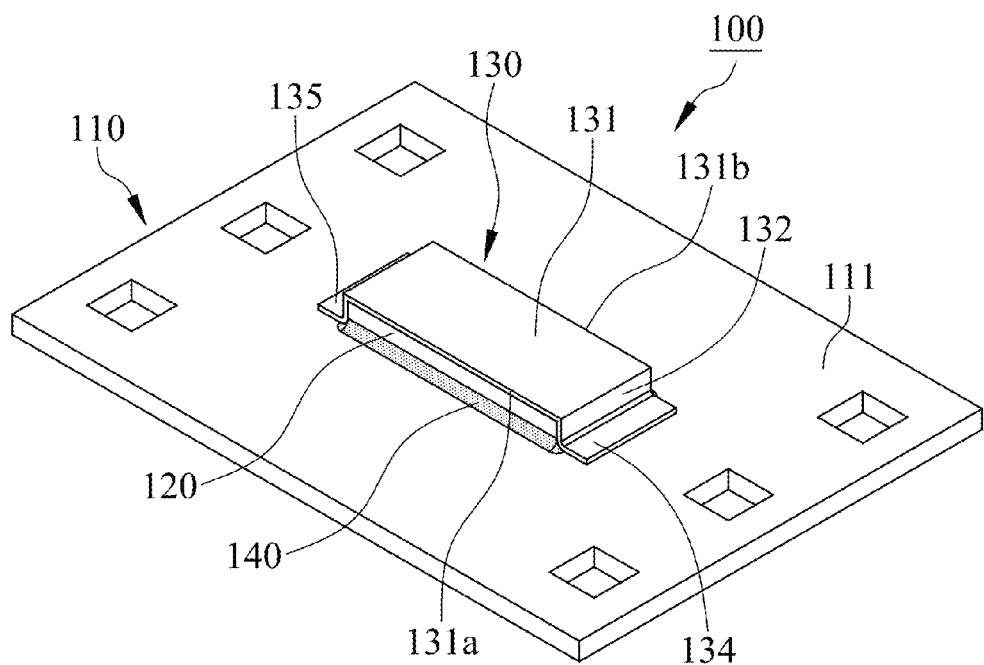
FIG. 4 is a perspective assembly diagram illustrating the heat dissipation package structure in accordance with the first embodiment of the present invention.

With reference to FIGS. 4 and 5, the covering portion 131 is disposed on the back surface 122 of the chip 120, the first lateral covering portion 132 is disposed on the third lateral surface 125, the second lateral covering portion 133 is disposed on the fourth lateral surface 126, and the first conducting portion 134 and the second conducting portion 135 are disposed on the conducting area 111b, wherein the first lateral covering portion 132 and the second lateral covering portion 133 cover the underfill 140. Heat dissipation efficiency of the chip 120 is able to be enhanced by the heat dissipation sheet 130 which conducts the thermal energy generated from the chip 120 to the substrate 110 and air.

Referring to FIG. 5, in this embodiment, the substrate 110 comprises a carrier 112, a trace layer 113 and a protection layer 114, wherein the surface 111 is the surface of the carrier 112. The trace layer 113 is disposed on the surface 111, the protection layer 114 covers the trace layer 113 and reveals the chip-disposing area 111a, wherein at least one conducting member 127 connects electrically to the trace layer 113 and the chip 120 located at the chip-disposing area 111a.

Figure 6:
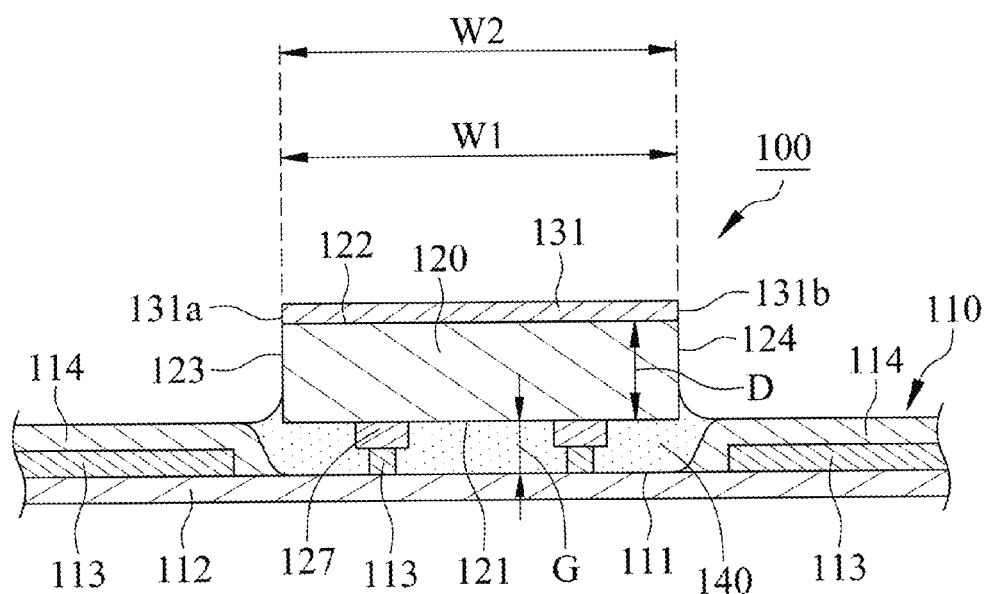
FIG. 6 is a cross-section view diagram illustrating the heat dissipation package structure in accordance with the first embodiment of the present invention.

Referring to FIG. 6, an interval G is defined between the active surface 121 of the chip 120 and the surface 111, and the interval G is the shortest distance between the active surface 121 and the surface 111. The chip 120 comprises a thickness D which is defined between the active surface 121 and the back surface 122, and the thickness D is the shortest distance between the active surface 121 and the back surface 122, wherein the second width W2 is not larger than summation of the first width W1, double the interval G and double the thickness D. In this embodiment, the second width W2 is substantially the same with the first width W1, or in other embodiment, the second width W2 is larger than half of the first width W1 and smaller than the first width W1.

Owing to the space between the heat dissipation sheet 130 and the substrate 110 is not sealed completely, the chip 120 disposed between the heat dissipation sheet 130 and the substrate 110 is not covered within completely sealed space, and the air can be exhausted through the gap among the heat dissipation sheet 130, the chip 120 and the substrate 110, to prevent the heat dissipation sheet 130 from deformation caused by air expansion and separation from the chip 120 or the substrate 110.

Figure 7:
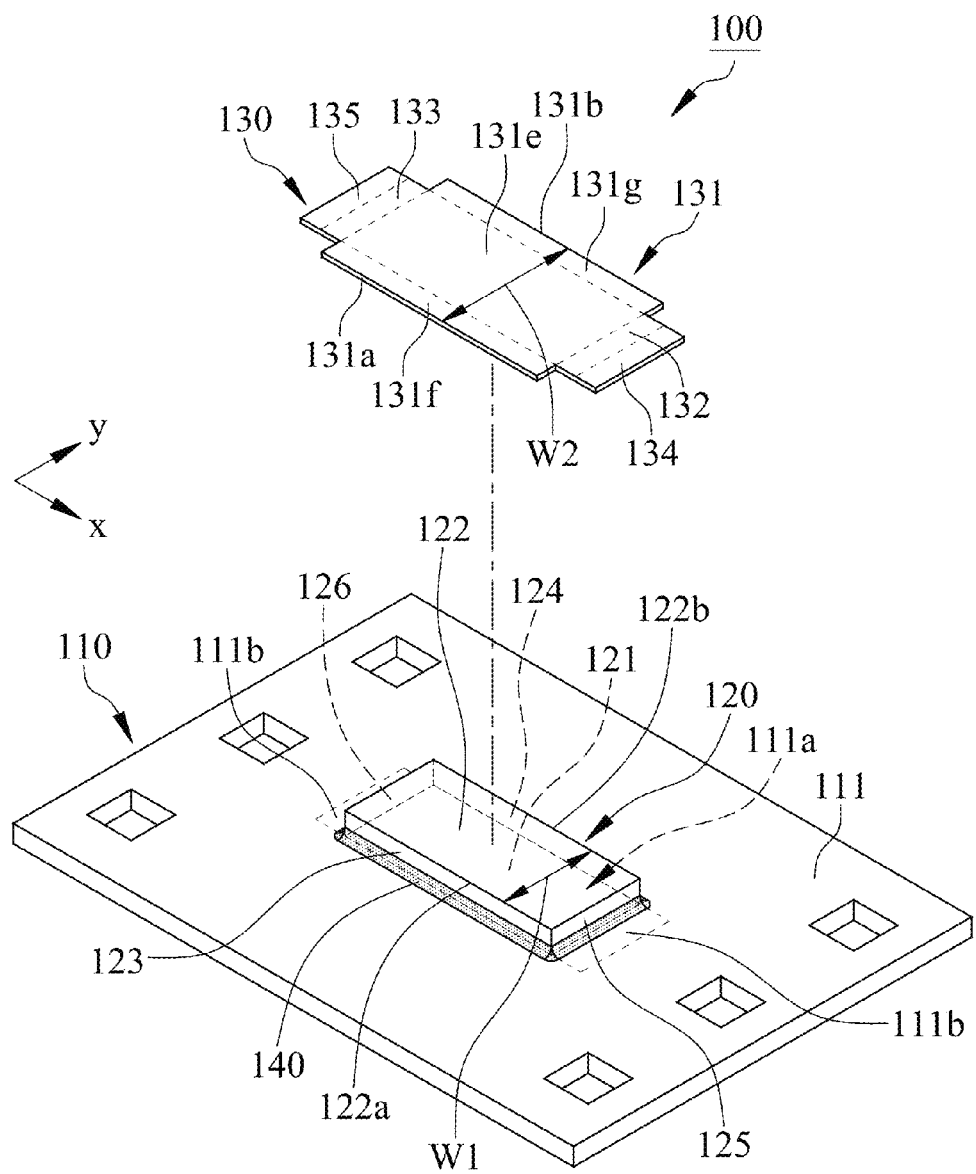
FIG. 7 is a perspective exploded diagram illustrating a heat dissipation package structure in accordance with a second embodiment of the present invention.

A second embodiment of the present invention is illustrated in FIG. 7, the primary difference between the second embodiment and the first embodiment is that the covering portion 131 at least comprises a first main portion 131e and a first outer lateral portion 131f. Preferably, the covering portion 131 further comprises a second outer lateral portion 131g, wherein the first main portion 131e is located between the first outer lateral portion 131f and the second outer lateral portion 131g, and the first main portion 131e connects with the first lateral covering portion 132 and the second lateral covering portion 133.

Figure 8:
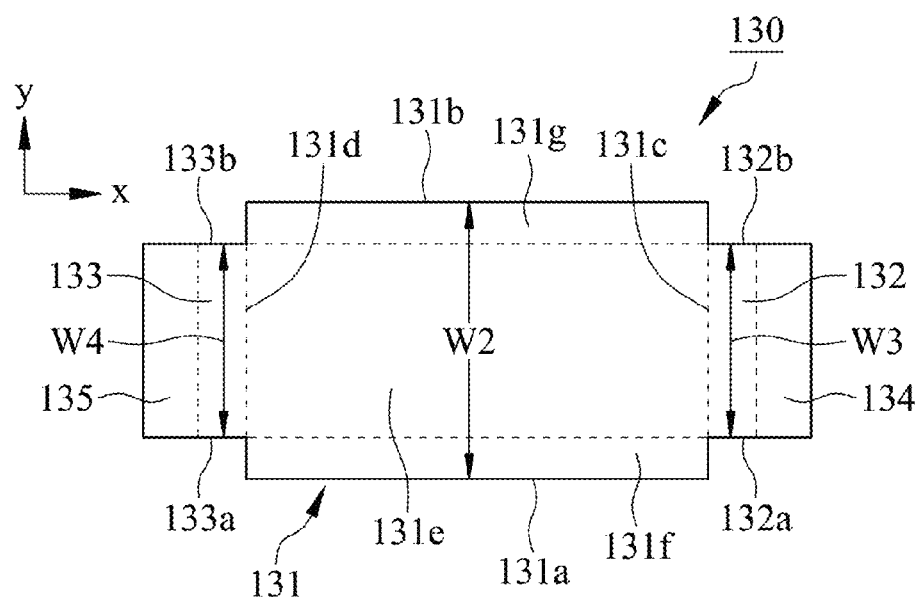
FIG. 8 is a top view diagram illustrating a heat dissipation sheet in accordance with the second embodiment of the present invention.

With reference to FIG. 8, the first lateral covering portion 132 comprises a fifth edge 132a adjacent to the first edge 131a and a sixth edge 132b adjacent to the second edge 131b, wherein a third width W3 is defined between the fifth edge 132a and the sixth edge 132b, and the third width W3 is the shortest distance between the fifth edge 132a and the sixth edge 132b in an axis line same with the second width W2. The second lateral covering portion 133 comprises a seventh edge 133a adjacent to the first edge 131a and an eighth edge 133b adjacent to the second edge 131b, wherein a fourth width W4 is defined between the seventh edge 133a and the eighth edge 133b, and the fourth width W4 is the shortest distance between the seventh edge 133a and the eighth edge 133b in an axis line same with the second width W2. With reference to FIGS. 7 and 8, in this embodiment, the second width W2 is larger than the first width W1, and the second width W2 is larger than the third width W3 or the fourth width W4.

Figure 9:
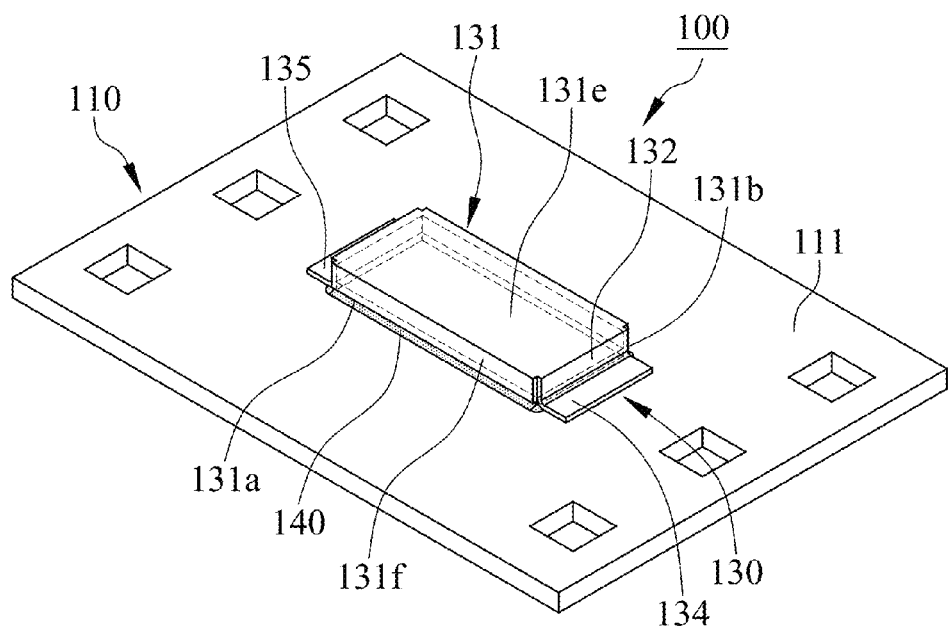
FIG. 9 is a perspective assembly diagram illustrating the heat dissipation package structure in accordance with the second embodiment of the present invention.
Figure 10:
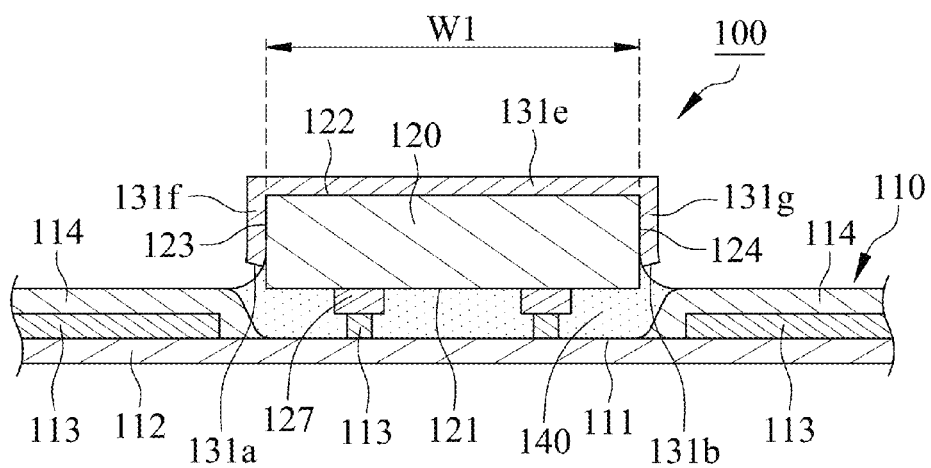
FIG. 10 is a cross-section view diagram illustrating the heat dissipation package structure in accordance with the second embodiment of the present invention.

Referring to FIGS. 9 and 10, the first main portion 131e of the covering portion 131 is disposed on the back surface 122 of the chip 120, the first outer lateral portion 131f is disposed on the first lateral surface 123, and the second outer lateral portion 131g is disposed on the second lateral surface 124. In this embodiment, the heat dissipation efficiency of the chip 120 is enhanced by the first outer lateral portion 131f and the second outer lateral portion 131g to increase the adhering area of the heat dissipation sheet 130.

Referring to FIG. 10, in this embodiment, the first outer lateral portion 131f and the second outer lateral portion 131g are not in contact with the substrate 110, so completely sealed space does not exist between the heat dissipation sheet 130 and the substrate 110. Air between the heat dissipation sheet 130 and the substrate 110 is able to be exhausted through the gap among the heat dissipation sheet 130, the chip 120 and the substrate 110 when the chip 120 disposed between the heat dissipation sheet 130 and the substrate 110 generates thermal energy, so as to prevent the heat dissipation sheet 130 separate from the chip 120 or the substrate 110 because deformation caused by air expansion.

Figure 11:
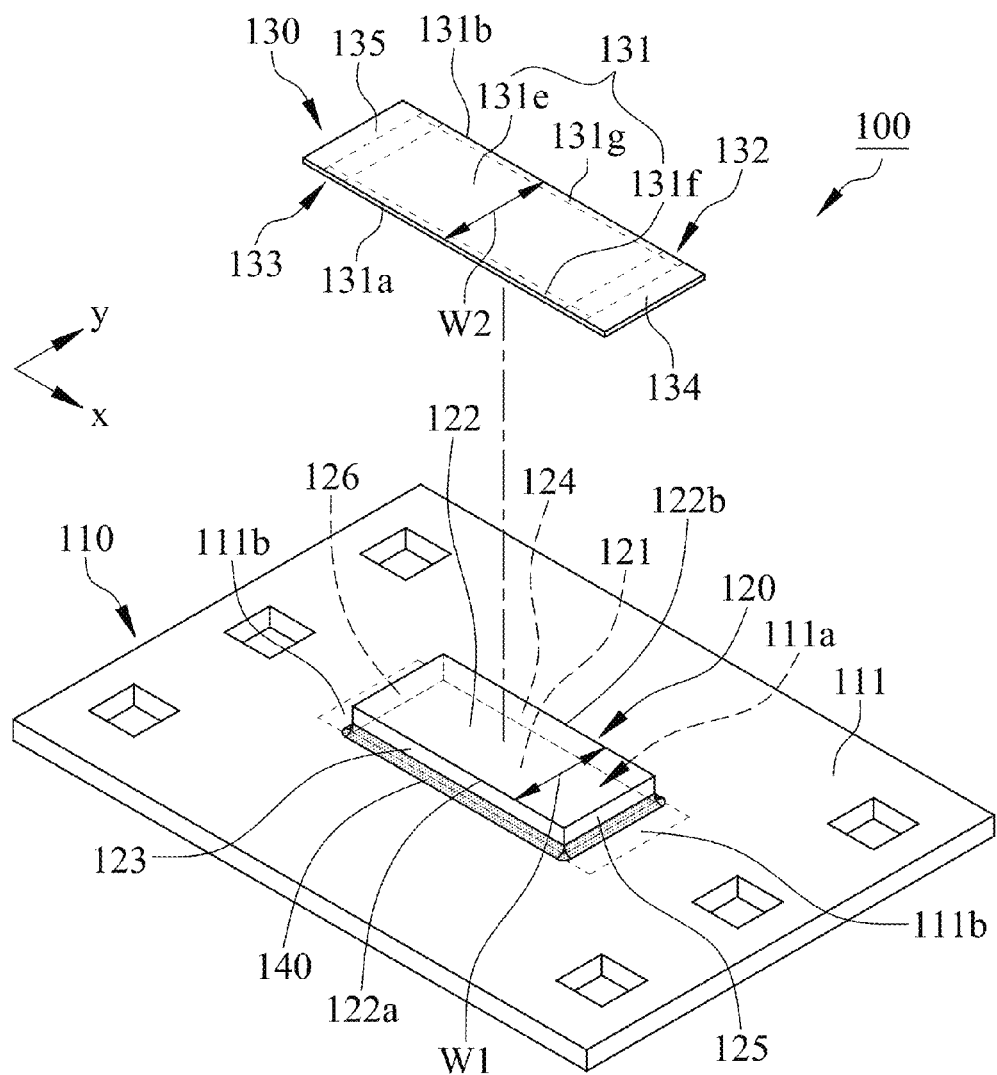
FIG. 11 is a perspective exploded diagram illustrating a heat dissipation package structure in accordance with a third embodiment of the present invention.
Figure 12:
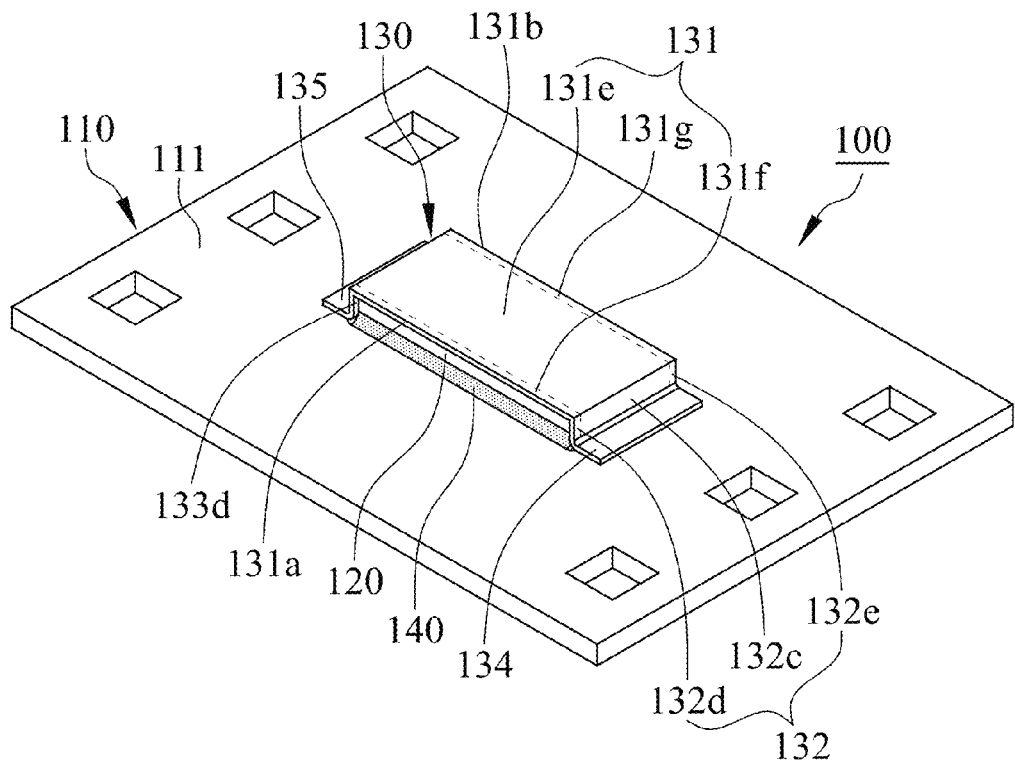
FIG. 12 is a perspective assembly diagram illustrating the heat dissipation package structure in accordance with the third embodiment of the present invention.
Figure 14:
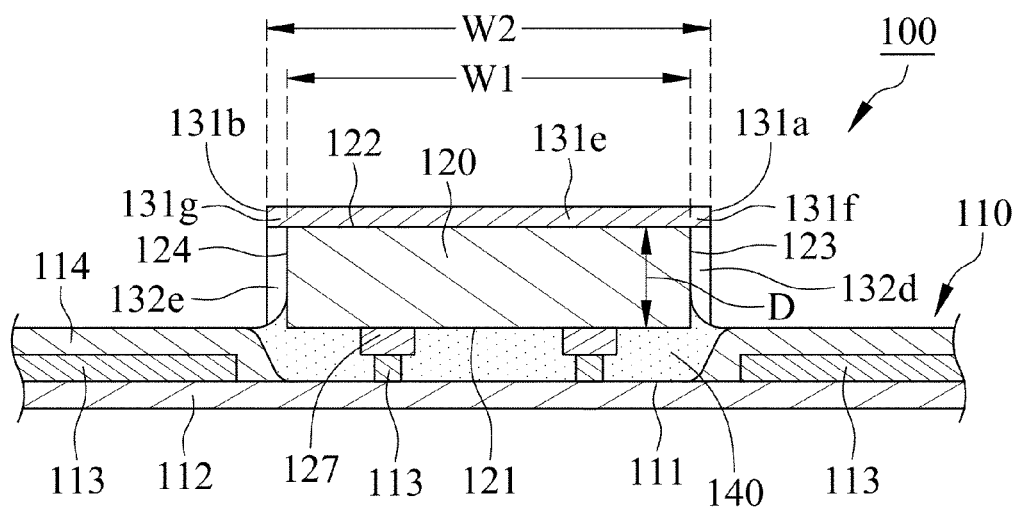
FIG. 14 is a cross-section view diagram illustrating the heat dissipation package structure in accordance with the third embodiment of the present invention.

A third embodiment of the present invention is illustrated in FIGS. 11, 12 and 14, the primary difference between the third embodiment and the second embodiment is that the first outer lateral portion 131f of the covering portion 131 protrudes to the first lateral surface 123, and the second outer lateral portion 131g of the covering portion 131 protrudes to the second lateral surface 124. Besides, the first outer lateral portion 131f and the second outer lateral portion 131g do not cover the first lateral surface 123 and the second lateral surface 124. In this embodiment, the second width W2 is larger than the first width W1, and the second width W2 is not larger than summation of the first width W1 and double the thickness D.

Figure 13:
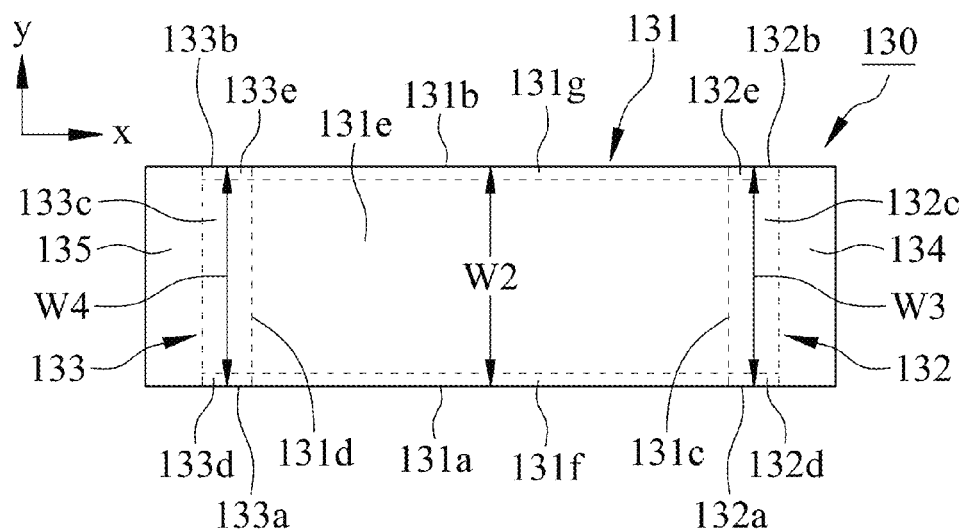
FIG. 13 is a top view diagram illustrating a heat dissipation sheet in accordance with the third embodiment of the present invention.

With reference to FIGS. 12 to 14, the first lateral covering portion 132 at least comprises a second main portion 132c and a third outer lateral portion 132d. Preferably, the first lateral covering portion 132 further comprises a fourth outer lateral portion 132e, wherein the second main portion 132c is located between the third outer lateral portion 132d and the fourth outer lateral portion 132e. The second main portion 132c, the third outer lateral portion 132d and the fourth outer lateral portion 132e respectively connect to the first main portion 131e, the first outer lateral portion 131f and the second outer lateral portion 131g of the covering portion 131, wherein the second main portion 132c is disposed on the third lateral surface 125, the third outer lateral portion 132d protrudes to the first lateral surface 123, and the fourth outer lateral portion 132e protrudes to the second lateral surface 124. In this embodiment, the third width W3 is substantially the same with the second width W2.

Figure 15:
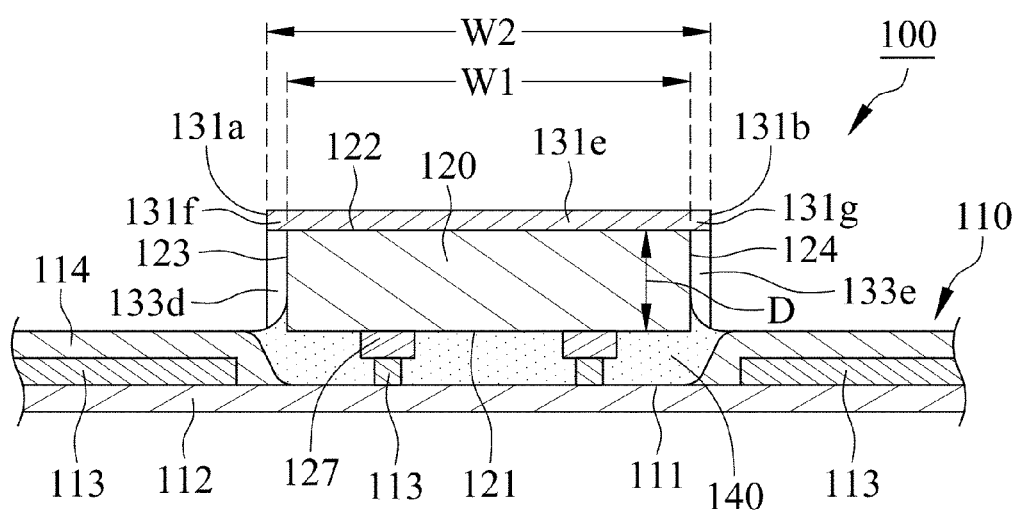
FIG. 15 is a cross-section view diagram illustrating the heat dissipation package structure in accordance with the third embodiment of the present invention.

With reference to FIGS. 12, 13 and 15, the second lateral covering portion 133 at least comprises a third main portion 133c and a fifth outer lateral portion 133d. Preferably, the second lateral covering portion 133 further comprises a sixth outer lateral portion 133e, wherein the third main portion 133c is located between the fifth outer lateral portion 133d and the sixth outer lateral portion 133e. The third main portion 133c, the fifth outer lateral portion 133d and the sixth outer lateral portion 133e respectively connect to the first main portion 131e, the first outer lateral portion 131f and the second outer lateral portion 131g of the covering portion 131, wherein the third main portion 133c is disposed on the fourth lateral surface 126, the fifth outer lateral portion 133d protrudes to the first lateral surface 123, and the sixth outer lateral portion 133e protrudes to the second lateral surface 124. In this embodiment, the fourth width W4 is substantially the same with the second width W2.

Figure 16:
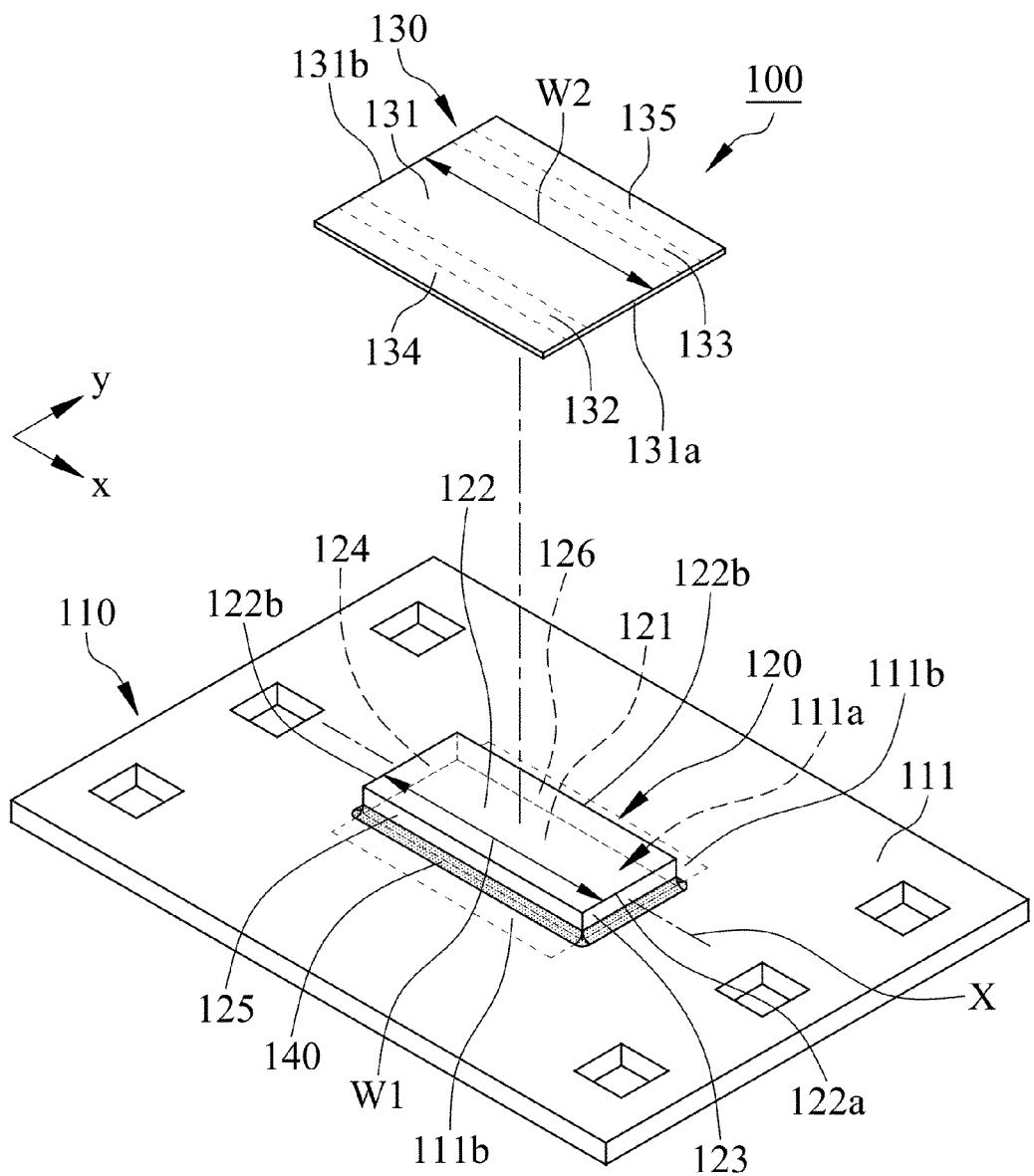
FIG. 16 is a perspective exploded diagram illustrating a heat dissipation package structure in accordance with a fourth embodiment of the present invention.
Figure 17:
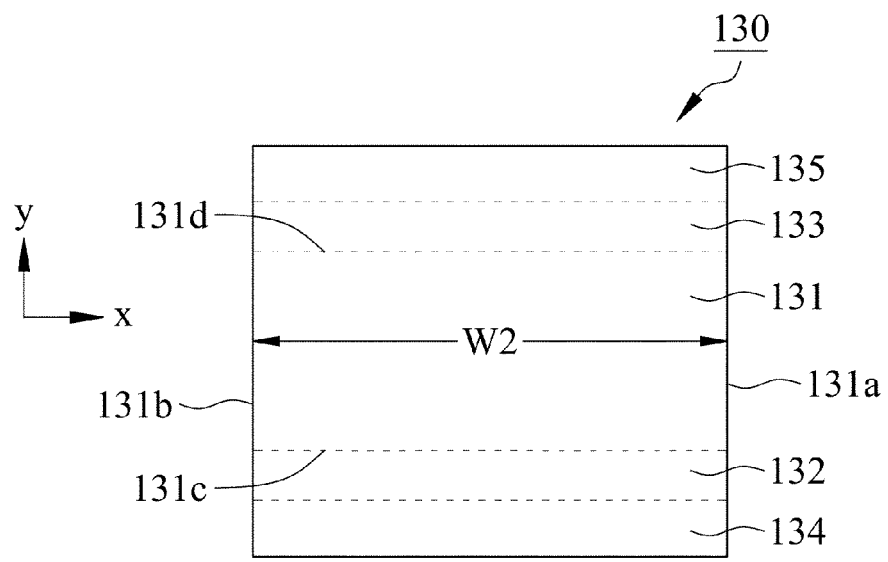
FIG. 17 is a top view diagram illustrating a heat dissipation sheet in accordance with the fourth embodiment of the present invention.
Figure 18:
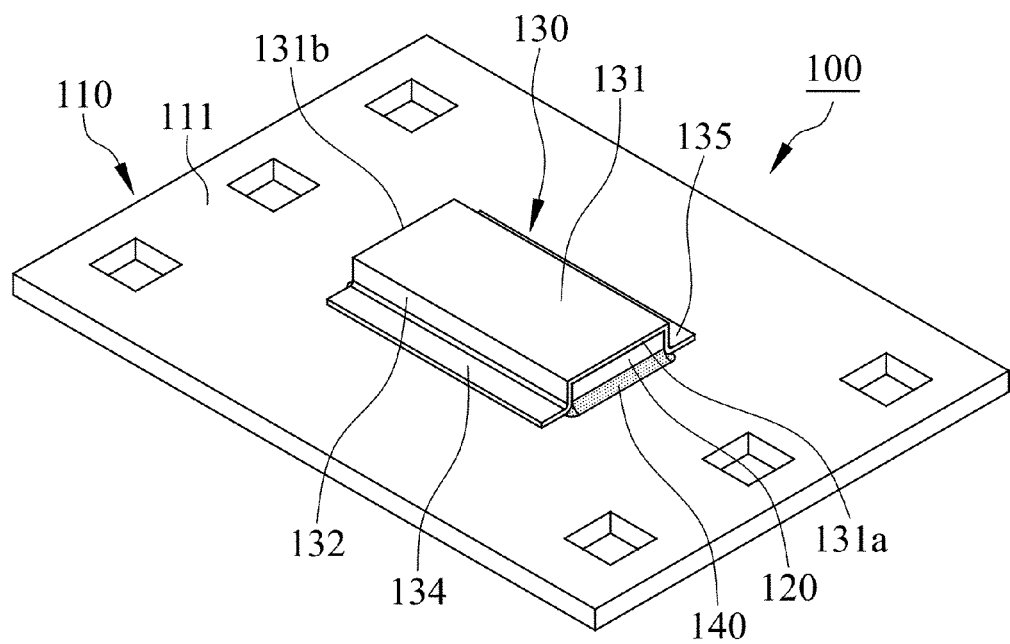
FIG. 18 is a perspective assembly diagram illustrating the heat dissipation package structure in accordance with the fourth embodiment of the present invention.

A fourth embodiment of the present invention is illustrated in FIGS. 16 to 18, the primary difference between the fourth embodiment and the first embodiment is that an axis line X passes through the first lateral surface 123 and the second lateral surface 124, wherein the first width W1 is defined between the first lateral side 122a and the second lateral side 122b of the back surface 122, and the second width W2 is defined between the first edge 131a and the second edge 131b of the covering portion 131. In the same direction of a x-axis line, the first width W1 is the shortest distance between the first lateral side 122a and the second lateral side 122b, and the second width W2 is the shortest distance between the first edge 131a and the second edge 131b, wherein the second width W2 is not larger than summation of the first width W1, double the interval G and double the thickness D. In this embodiment, the second width. W2 is substantially the same with the first width W1, or in other embodiment, the second width W2 is larger than half of the first width W1 and smaller than the first width W1.

In this embodiment, the first lateral side 122a and the second lateral side 122b are the short sides of the back surface 122, and the first edge 131a and the second edge 131b are the short sides of the covering portion 131. The first lateral covering portion 132 and the second lateral covering portion 133 are respectively disposed on the third lateral surface 125 and the fourth lateral surface 126 which have larger area, and the first conducting portion 134 and the second conducting portion 135 are respectively disposed on the conducting areas 111b which have larger area, so the adhering area of the heat dissipation sheet 130 is increased to enhance heat dissipation efficiency of the chip 120.

While this invention has been particularly illustrated and described in detail with respect to the preferred embodiments thereof, it will be clearly understood by those skilled in the art that is not limited to the specific features shown and described and various modified and changed in form and details may be made without separation from the spirit and scope of this invention.

What is claimed is:

1. A heat dissipation package structure including:
   a substrate having a surface, the surface comprises a chip-disposing area and at least one conducting area located outside of the chip-disposing area;
   a chip disposed on the chip-disposing area and revealing the conducting area, the chip connects electrically to the substrate and comprises an active surface, a back surface, a first lateral surface, a second lateral surface, a third lateral surface and a fourth lateral surface, wherein the active surface faces toward the surface of the substrate, the first lateral surface is opposite to the second lateral surface, and the third lateral surface is opposite to the fourth lateral surface, wherein an interval is defined between the active surface of the chip and the surface of the substrate, and a thickness is defined between the active surface and the back surface of the chip, the back surface comprises a first lateral side connected to the first lateral surface and a second lateral side connected to the second lateral surface, wherein a first width is defined between the first lateral side and the second lateral side; and a heat dissipation sheet being integrated and at least comprising a covering portion, a first conducting portion and a first lateral covering portion located between the covering portion and the first conducting portion, wherein the covering portion is disposed on the back surface of the chip, the first lateral covering portion is disposed on the third lateral surface, and the first conducting portion is disposed on the conducting area, wherein the covering portion comprises a first edge adjacent to the first lateral surface, a second edge adjacent to the second lateral surface, a third edge adjacent to the third lateral surface and a fourth edge adjacent to the fourth lateral surface, the third edge connects to the first lateral covering portion, wherein the first edge and the second edge are edges of the heat dissipation sheet and a shortest distance between the first edge and the second edge before bending the heat dissipation sheet is defined as a second width, and wherein the second width is not larger than summation of the first width and double the thickness in same axis direction.

2. The heat dissipation package structure in accordance with claim 1 further includes underfill filling up between the active surface and the surface, wherein the first lateral covering portion covers the underfill.

3. The heat dissipation package structure in accordance with claim 1, wherein the second width is substantially the same with the first width.

4. The heat dissipation package structure in accordance with claim 1, wherein the second width is larger than half of the first width and smaller than the first width.

5. The heat dissipation package structure in accordance with claim 1, wherein the heat dissipation sheet further comprises a second conducting portion and a second lateral covering portion located between the covering portion and the second conducting portion, and the fourth edge connects to the second lateral covering portion, wherein the second lateral covering portion is disposed on the fourth lateral surface, and the second conducting portion is disposed on the conducting area.

6. The heat dissipation package structure in accordance with claim 1, wherein the covering portion at least comprises a first main portion disposed on the back surface of the chip and a first outer lateral portion disposed on the first lateral surface, and the second width is larger than the first width.

7. The heat dissipation package structure in accordance with claim 6, wherein the first outer lateral portion is not in contact with the substrate.

8. The heat dissipation package structure in accordance with claim 6, wherein the covering portion further comprises a second outer lateral portion, the first main portion is located between the first outer lateral portion and the second outer lateral portion, and the second outer lateral portion is disposed on the second lateral surface.

9. The heat dissipation package structure in accordance with claim 6, wherein the first lateral covering portion comprises a fifth edge adjacent to the first edge and a sixth edge adjacent to the second edge, and a third width is defined between the fifth edge and the sixth edge, wherein the second width is larger than the third width.

10. The heat dissipation package structure in accordance with claim 1, wherein the covering portion at least comprises a first main portion and a first outer lateral portion, the first main portion is disposed on the back surface of the chip, and the first outer lateral portion protrudes to the first lateral surface.

11. The heat dissipation package structure in accordance with claim 10, wherein the covering portion further comprises a second outer lateral portion, the first main portion is located between the first outer lateral portion and the second outer lateral portion, and the second outer lateral portion protrudes to the second lateral surface.

12. The heat dissipation package structure in accordance with claim 10, wherein the first lateral covering portion at least comprises a second main portion and a third outer lateral portion, the second main portion is disposed on the third lateral surface, and the third outer lateral portion protrudes to the first lateral surface.

13. The heat dissipation package structure in accordance with claim 12, wherein the first lateral covering portion further comprises a fourth outer lateral portion, the second main portion is located between the third outer lateral portion and the fourth outer lateral portion, and the fourth outer lateral portion protrudes to the second lateral surface.

14. The heat dissipation package structure in accordance with claim 13, wherein the first lateral covering portion further comprises a fifth edge adjacent to the first edge and a sixth edge adjacent to the second edge, a third width is defined between the fifth edge and the sixth edge, wherein the third width is substantially the same with the second width.

* * * * *